United States Patent [19]

Sherman

[11] Patent Number: 5,192,590
[45] Date of Patent: Mar. 9, 1993

[54] COATING METAL ON POLY(ARYL ETHER KETONE) SURFACES

[75] Inventor: Edward S. Sherman, Sunnyvale, Calif.

[73] Assignee: Raychem Corporation, Menlo Park, Calif.

[21] Appl. No.: 452,170

[22] Filed: Dec. 18, 1989

Related U.S. Application Data

[63] Continuation-in-part of Ser. No. 431,515, Nov. 3, 1989, abandoned.

[51] Int. Cl.$^5$ .............................................. B05D 3/10
[52] U.S. Cl. ................................. 427/304; 427/305; 427/306; 427/307; 427/404; 204/192.14
[58] Field of Search .............. 427/307, 304, 306, 404; 264/192.14

[56] References Cited

U.S. PATENT DOCUMENTS

| | | | |
|---|---|---|---|
| 1,472,244 | 10/1923 | Daly | 427/307 |
| 3,501,332 | 3/1970 | Buckman | 427/307 |
| 3,518,667 | 6/1970 | Barth | 427/307 |
| 3,563,784 | 2/1971 | Innes | 427/307 |
| 3,574,070 | 4/1971 | Sahely | 427/307 |
| 3,607,473 | 9/1971 | Grunwald | 427/307 |
| 3,689,303 | 9/1972 | MacGuire et al. | 427/307 |
| 4,054,693 | 10/1977 | Leech et al. | 427/307 |
| 4,709,007 | 11/1987 | Jansons | 528/222 |

FOREIGN PATENT DOCUMENTS

| | | |
|---|---|---|
| 0216513 | 4/1987 | European Pat. Off. |
| 62-63674 | 3/1987 | Japan |

Primary Examiner—Janyce Bell
Attorney, Agent, or Firm—Marguerite E. Gerstner; Herbert G. Burkard

[57] ABSTRACT

A method of coating metal on a poly(aryl ether ketone) surface comprises treating the surface with a swelling agent, removing the swelling agent, etchinig the treated surface and then plating the etched surface with a metal using an electroless plating process. The process can be used to metal plate articles of poly(aryl ether ketones) of complex shapes, such as electrical connectors. Exceptional bond strength between the metal and the poly(aryl ether ketone) surface is obtained. Poly(aryl ether ketone) compositions, even those containing little, or no, glass or mineral fillers can be plated with a strongly adherent coating of plated metal using a process of this invention. The poly(aryl ether ketone) may contain additives such as pigments, fillers, stabilizers, reinforcing agents or the like. Blends of poly(aryl ether ketones) with other polymers, such as polyetherimides, fluoroelastomers, or the like, can be treated in accordance with this invention.

19 Claims, No Drawings

COATING METAL ON POLY(ARYL ETHER KETONE) SURFACES

This application is a continuation in part of U.S. application Ser. No. 07/431,515, filed Nov. 3, 1989, now abandoned the entire disclosure of which is incorporated herein by reference.

BACKGROUND OF THE INVENTION

This invention relates to a method of coating a surface comprising a poly(aryl ether ketone) composition with metal and to certain articles having a surface comprising a poly(aryl ether ketone) composition plated with metal.

Poly(aryl ether ketones) are high performance engineering polymers useful for making a variety of articles by various melt processing techniques such as, injection molding, extrusion, and the like. For certain uses it may be desirable that metal be coated on the poly(aryl ether ketone) surface. For example, it is desirable to provide a molded connector of poly(aryl ether ketone) with a metal coating, thereby producing a shielded connector. Conventional methods of metal plating polymeric surfaces generally result in poly(aryl ether ketone) plated surfaces in which the bond strength between the metal and the surface is commercially unsatisfactory, especially if the poly(aryl ether ketone) contains little, if any, glass or mineral fillers.

SUMMARY OF THE INVENTION

One aspect of the invention comprises a method of plating a surface comprising a poly(aryl ether ketone) composition with metal which comprises:

a) treating the surface with a swelling agent for a period of time sufficient to swell the surface;
b) removing the swelling agent;
c) etching the treated surface; and
d) plating metal on the etched surface.

A further aspect of this invention comprises an article having a surface comprising a poly(aryl ether ketone) composition containing substantially no glass and/or mineral filler and having a plated metal coating thereon in which the bond strength between the surface and the plated metal coating is at least about 3 pounds per linear inch (pli). In preferred embodiments, articles having a surface comprising a poly(aryl ether ketone) composition containing different amounts of glass and/or mineral filler have a plated metal coating in which the bond strength between the metal and the surface meets specified minimum values. The process of the present invention is particularly advantageous for electroless plating articles of complex configuration or articles containing blind holes, cavities and high aspect ratio channels such as tubes, pipes and connectors. The plating can reach all areas of these parts since all etching, treating and plating is done with fluids which can cover the part completely. Plating can be complete or selective if masking or light radiation sensitive catalyst systems are employed, and the thickness and coating compositions can be varied for specific applications by combining electrolytic plating once a thin conductive layer has been applied by the electroless process.

DETAILED DESCRIPTION OF THE INVENTION

The surface plated in accordance with this invention comprises a poly(aryl ether ketone) composition. Poly(aryl ether ketones) are known thermoplastic polymers which possess excellent properties such as chemical resistance, dielectric properties, high melting and glass transition temperature, excellent elongation and strength properties. As a result the polymers have a variety of uses and can be made into articles of various shapes or coated onto an article to provide a surface of poly(aryl ether ketone). The term "poly(aryl ether ketone)" is used herein to include poly(aryl thioether ketones).

Poly(aryl ether ketones) have the general formula:

wherein Ar and Ar' are aromatic moieties at least one of which contains a diaryl ether linkage forming part of the polymer backbone and wherein both Ar and Ar' are covalently linked to the carbonyl groups through aromatic carbon atoms.

Preferably, Ar and Ar' are independently selected from phenylene and polynuclear aromatic moieties, such as naphthalene and biphenylene. The term polynuclear aromatic moieites is used to mean aromatic moieties containing at least two aromatic rings. The rings can be fused, joined by a direct bond or by a linking group. Such linking groups include for example, carbonyl, ether, sulfone, sulfide, amide, imide, azo, quinoxaline, benzimidazole, benzothiazole, benoxazole, alkylene, perfluoro-alkylene and the like. See, for example, copending application Ser. No 06/790,286 filed Oct. 22, 1985, now U.S. Pat. No. 4,868,271, the disclosure of which is incorporated herein by reference. As mentioned above, at least one of Ar and Ar' contains a diaryl ether or thioether linkage.

The phenylene and polynuclear aromatic moieties can contain substituents on the aromatic rings. These substituents should not inhibit or otherwise interfere with the polymerization reaction to any significant extent. Such substituents include, for example, phenyl, halogen, nitro, cyano, alkyl, 2-alkynyl and the like.

Typical poly(aryl ether ketones) and methods for their manufacture can be found, for example in U.S. Pat. Nos. 3,953,400 to Dahl, 3,956,240 to Dahl et al, 4,247,682 to Dahl, 4,320,224 to Rose, 4,709,007 to Jansons et al, 4,826,947 to Jansons et al, 4,820,792 to Towle, and 4,841,013 to Towle; European Patent Application No. 315,441 to Towle et al; and International Patent Application WO08904848 to Towle, the disclosures of each of the above are incorporated herein by reference.

Poly(aryl ether ketones) having the following repeat units (the simplest repeat unit being designated for a given polymer) are preferred:

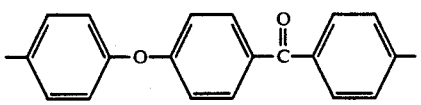

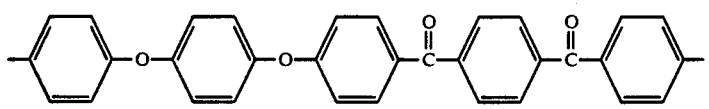
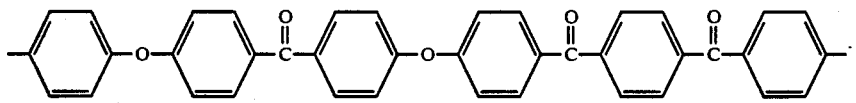
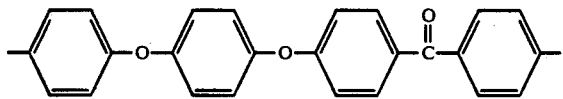
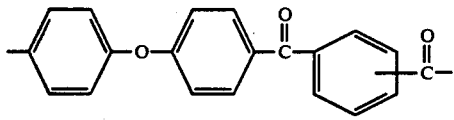
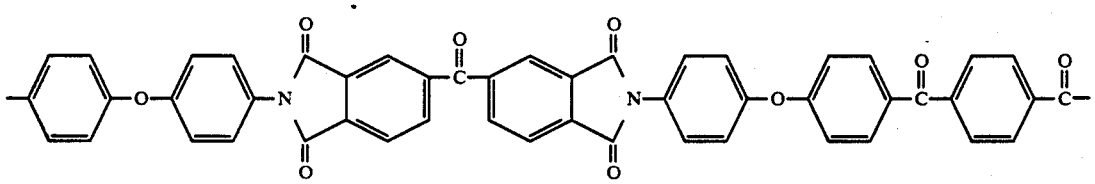
a copolymer having the repeat units:
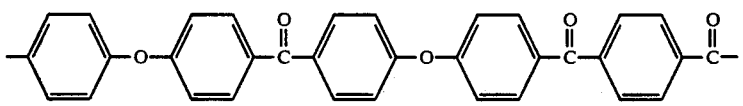
and
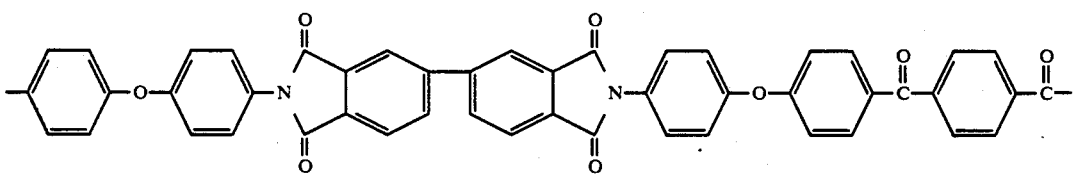
a copolymer having the repeat units:
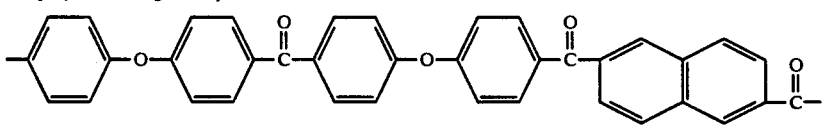
and
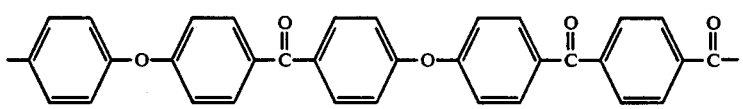
a copolymer having the repeat units:
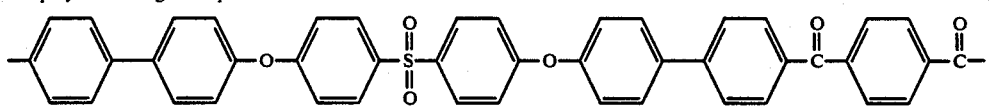
and
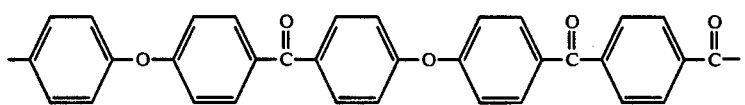

and a copolymer having the repeat units:

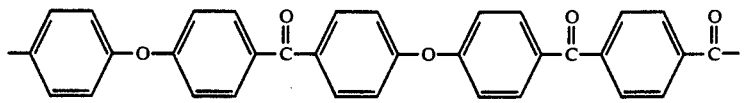

and

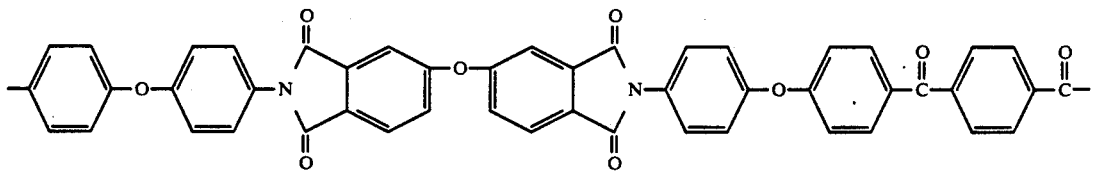

The poly(aryl ether ketone) compositions can contain various additives, including pigments, stabilizers, fillers, reinforcing agents, cross-linking agents and the like. For example, the composition may contain glass fibers. However, unlike certain prior art processes, the compositions treated in accordance with this invention need not contain substantial amounts of glass and/or mineral filler in order to obtain a strong bond between the poly(aryl ether ketone) surface and the plated metal. Since high levels of glass filler can result in poor mechanical properties, articles made of a highly glass filled poly(aryl ether ketone) composition may be too brittle, have poor impact resistance and lack sufficient elongation for particular applications. In addition it is frequently difficult, if not impossible, to achieve uniform dispersion of the filler particles in complex moldings. A phenomenon known as "fiber wash" occurs in which the resin separates from the filler during mold flow. Poor plating adhesion and plating failure can then occur in areas that are thus resin enriched. Thus, in certain preferred embodiments, the surface consists essentially of poly(aryl ether ketone). Additives for improving the adhesion between the plated metal and the poly(aryl ether ketone) surface are not necessary. However, it has been found that the presence of glass filler and etching some of the glass results in higher bond strengths between the poly(aryl ether ketone) surface and the metal than between an unfilled polymer and metal using the process of this invention. In other preferred embodiments, blends of poly(aryl ether ketones) with other polymers such as carboxylated polymers, epoxy resins, fluoropolymers, including fluoroelastomers, glycidyl ester copolymers, liquid crystal polymers, phenolaldeyde aldehyde resins, poly(amide imide), poly(amide), poly(benzobisthiazole), poly(benzimidazole) poly(carbonate), polyesters, poly(ether imides), poly(ether ketones), poly(ether sulfones), poly(imides), poly(phenylene oxide), poly(phenylene sulfide), poly(siloxanes), poly(sulfones) and the like are employed in preparing articles to be plated in accordance with this invention. Particularly preferred blends are blends of a poly(aryl ether ketone) with a poly(ether imide), a propylene-tetrafluoroethylene copolymer, poly(ether sulfone) or poly(phenylene sulfide). Preferably the blend contains at least about 50 wt % poly(aryl ether ketone).

The poly(aryl ether ketone) composition may contain relatively minor amounts of an incompatible polymer, such as polytetrafluoroethylene.

As mentioned above, the surface comprising a poly(aryl ether ketone) composition can be a surface layer of a composite article or the surface may be of an article made of the poly(aryl ether ketone) composition. Poly(aryl ether ketones) are melt processable polymers which can readily be made into articles by e.g. extrusion, injection molding, and other melt processing techniques. Articles of complex configurations, such as connectors can be plated in accordance with this invention.

Another advantage to the process of this invention is the retention of physical properties such as tensile strength, elongation and impact strength after the article has been plated. Certain prior art processes can cause microcracks in the polymer which can result in poor product performance.

After formation of the article, it is preferred to anneal the polymer by heating the polymer to a temperature of about 150° to about 300° C., preferably about 200° to about 250° C. for about 5 to about 500 minutes, preferably about 30 to about 180 minutes. Annealing of the polymer in this manner reduces stress in the polymer imparted during formation of the article and may increase crystallinity of the polymer.

The surface is first treated in accordance with this invention with a swelling agent. The swelling agent used is generally a liquid which is a solvent for the poly(aryl ether ketone). Poly(aryl ether ketones) are chemically resistent polymers but are soluble in strong acids, super acids and other solvents. Solvents used in preparing the polymers, such as those disclosed in the above mentioned U.S. patents on the synthesis of poly(aryl ether ketones) can be used as a swelling agent in the method of this invention. Strong acids which can be used include for example, concentrated sulfuric acid (preferably an aqueous solution containing at least 70 wt. % sulfuric acid) and mixtures thereof with phosphoric acid in amounts of less than 50% by weight, based on the weight of the mixture, hydrofluoric acid, chlorosulfonic acid and the like. Super acids which can be used include for example fluorosulfuric acid; trifluoroalkane sulfonic acids, such as trifluoromethane sulfonic acid, and mixtures thereof with antimony, tantalum or niobium pentafluoride; and mixtures of antimony, arsenic, tantalum, niobium and/or boron pentafluoride with hydrogen fluoride. Other solvents include for example Lewis acid-Lewis base complexes, preferably with a diluent, such as the solvents disclosed in U.S. Pat. No. 4,709,007, the disclosure of which is incorporated herein by reference, diphenyl sulfone, N-methyl caprolactam and any other solvent capable of dissolving the poly(aryl ether ketone). It is preferable to use strong acids and acid mixtures which are solvents at room temperature. Other solvents, such as diphenyl sulphone and N-methyl caprolactam, may be used at elevated temperatures between Tg and Tm, but can result in part deformation and shrinkage under these conditions.

The surface is treated with the swelling agent by contacting the surface therewith in any convenient manner. For example, the article (or at least the surface thereof to be plated) can be immersed in the swelling agent. Other techniques such as spraying, can be used if desired. Generally the surface is in contact with the swelling agent for about 0.1 to about 60 minutes, preferably from about 0.5 to about 10 minutes and most preferably from about 1 to about 4 minutes. Treatment with the swelling agent generally is conducted at ambient temperatures. Higher temperatures may be used, if desired and may be required if a swelling agent having a high melting point, e.g. diphenyl sulfone, is used.

Following treatment with the swelling agent, the swelling agent is removed. It can be removed, for example, by evaporating the solvent, optionally by applying heat. A preferred method of removing the swelling agent is to apply to the swollen surface a liquid which is not a solvent for the poly(aryl ether ketone) and which is compatible, preferably miscible, with the swelling agent. The liquid can be applied in any convenient manner. Typically it is applied by immersing the swollen surface in the liquid. The liquid should contact the surface from about 0.1 to about 30 minutes, preferably from about 0.5 to about 10 minutes and most preferably from about 1 to about 4 minutes. The time required to effect removal of the swelling agent depends on the nature of the swelling agent used and the liquid used for its removal. Generally it has been found that the time required to remove the swelling agent varies depending on the length of time the swelling agent has been in contact with the surface and the extent to which the surface is swollen. The swelling agent need not be removed before being subjected to the etch process described below if the swelling agent is compatible with the liquid of the etch solution. In such a case, the swelling agent may be removed from the surface and the surface etched in a single step.

While not wishing to be bound by any theory, it is believed that treatment of the surface with a swelling agent followed by removal of that agent sufficiently roughens the surface to improve the adhesion of the plated metal coating. In preferred embodiments, for example when concentrated sulfuric acid is used as the swelling agent, the surface is chemically modified as well as roughened. It has been found that the oxygen content of the surface is increased when sulfuric acid is used as the swelling agent. It is believed, but not understood, that the increased oxygen content improves the bond strength between the poly(aryl ether ketone) surface and the plated metal.

The treated surface is etched by exposing the surface to an oxidative-etchant solution. The etchant solution is preferably an aqueous solution containing $Cr^{+6}$ or permanganate or persulfate ions. The solution may also contain sulfuric acid, phosphoric acid, surfactants, stabilizers or the like. A preferred etchant is a solution of chromic acid and sulfuric acid. Typical commercial etchants are EMC-1540 and Circuposit® MLB213 available from Shipley Company Inc. of Newton, Mass., Sel-Rex®, and Circuitprep® 2030 (sodium persulfate) CP2038 available from OMI International Corporation of Orange, Calif. Surfactants, such as perfluorinated sulfonates, may be added to insure uniform etching of the surface. The concentration of the etchant solution may vary widely with the chromium component added as $CrO_3$ being, by weight, about 100 grams/liter (g/l) to saturation, preferably about 200 to 600 g/l, and most preferably about 300 to 500 g/l. The acid component is about 100 to 500 g/l, and more preferably about 200 to 400 g/l. A preferred composition contains about 400-450 g/l $CrO_3$, e.g., 420 g/l, and 250-350 g/l $H_2SO_4$, e.g., 300 g/l.

The surface is generally exposed to the etchant solution for about 1 to about 60 minutes, preferably from about 5 to about 30 and most preferably from about 10 to about 20 minutes. The temperature at which the etching process is conducted is typically about 70°-85° C., but higher or lower temperatures can be used depending on the composition of the etchant used.

Following the etching process, excess chromium can be removed by treatment with a neutralizing agent, e.g. sodium bisulfite or a reducing agent such as hydrazine or oxalic acid.

If the poly(aryl ether ketone) composition of the surface contains substantial amounts of glass and/or mineral filler, e.g. above about 5% by weight, based on the weight of the composition, the surface may be subjected to an additional etching procedure, if desired, to etch and/or remove the glass or mineral filler as discussed below. Etching the glass can be accomplished by immersing the surface in an acidic fluoride solution, i.e. a solution which consists of 300 to 350 grams per liter of ammonium bifluoride and 5.5 to 6.5 wt % sulfuric acid, for 4 to 10 minutes. Complete dissolution of all exposed glass and mineral fillers can be completed by a further immersion in 25% sulfuric acid in water for 10 to 30 minutes.

The etched resin is now prepared for metal plating by known means to render the surface catalytic. Among them are cleaning, applying catalyst promoters, sensitizing using an aqueous tin chloride solution and then activating by means of palladium chloride. On the other hand, unitary baths may be employed for such purposes, such as the dispersions of colloidal palladium and tin ions described in Shipley, U.S. Pat. No. 3,911,920 or the soluble complexes of noble metals, stannous ion and anions as described in Zeblisky, U.S. Pat. No. 3,672,938. The surface may now be plated with a film of metal by electroless plating. Activating and plating compositions and methods for copper metal electroless deposition are described in U.S. Pat. Nos. 2,874,072; 3,011,920; 3,075,855; 3,095,309; 3,672,938; and 3,736,156; the disclosures of which are incorporated herein by reference. Alternative methods of metallizing plastic articles are vacuum vapor deposition and sputtering, flame and arc spraying, melt lamination with metal foil and sintering with metal powder. Vacuum deposition and spray coating techniques are frequently unsuitable for complex shaped articles containing blind holes, cavities and high aspect ratio channels such as tubes, pipes and connectors as they cannot cover these articles completely with metal. In addition the coating rates of these processes are too slow to permit economically feasible depositions of thickness greater than 1 to 3 microns.

Melt lamination of foil and metal powder sintering are generally only appropriate for planar substrates which do not require metallization on edges or through holes between the top and bottom surface, such as would be required in double sided printed wiring board substrates.

The term "plated metal coating" is used herein to mean a coating which has been deposited on the poly(aryl ether ketone) surface by an electroless plating method. The article may have additional metal layers on top of the initial electroless plated layer.

After the electroless plating step the article may be subjected to a second annealing step. Preferably the article is heated in this second annealing step to a temperature of about 100° to about 300° C., preferably of about 150° to about 250° C. The article is annealed for about 30 to about 500 minutes, preferably about 200 to about 300 minutes. The second annealing step improves the bond strength between the surface and the plated metal coating. It is believed that this may be due to reduction of water content at the interface between the polymer and the metal. Alternatively, the article may be subjected to this annealing step after a further metal layer has been applied, e.g. by electroplating.

The following examples illustrate the method and article of this invention. In the examples, the following polymers were used.

PEK - a polymer having the repeat unit:

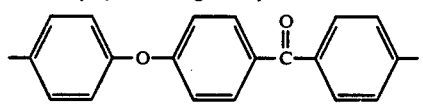

PEEK - a polymer having the repeat unit:

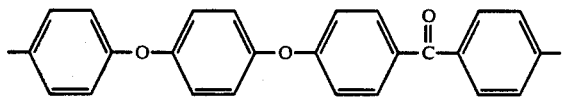

PEKEKK - a polymer having the repeat unit:

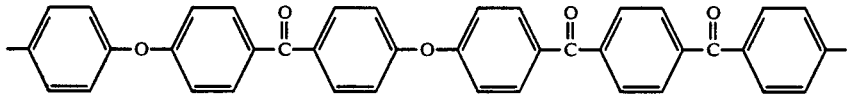

PEKI - a copolymer having the repeat units:

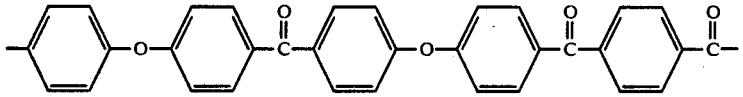

and

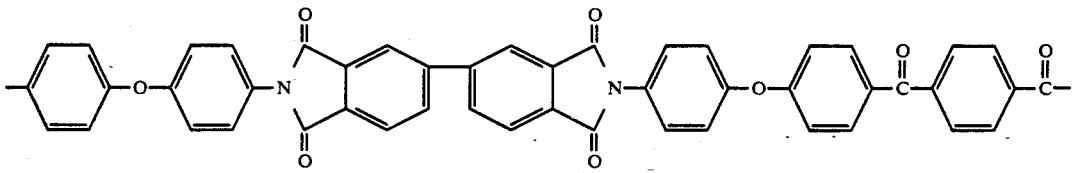

Aflas ® - a propylene-tetrafluoroethylene elastomeric copolymer manufactured by Asahi Glass Company, Ltd.
Ultem ®2300 - a polyetherimide containing 30 weight % glass fiber available from GE Plastics of Pittsfield, Massachusetts

EXAMPLES 1–8 AND 10–38

1. Sample Preparation

Poly(aryl ether ketone) resin samples, optionally containing glass fiber or other polymers noted in Table 1, were injection molded in test plaques 3" by 3" by 0.10". These plaques were then annealed at 250° C. for 3 hours to complete crystallization and/or remove molding stresses.

2. Basic Procedure of Preparing the Surface for Plating

Plaques were then immersed and agitated in concentrated sulfuric acid (VWR scientific, Reagent A.C.S.) for 3.5 minutes. Care was taken not to allow parts to touch each other as they would stick and deform on separation. The parts were then placed in a bath of tap water at room temperature and rinsed for 5 minutes. Etching was then performed in a chromic acid solution consisting of 366 grams of chromium trioxide ('Baker Analyzed ®' Reagent) dissolved in a mixture of 200 milliliters of concentrated sulfuric acid made up to 1 liter with tap water. The etching process was carried out at 75° to 85° C. for 20 minutes. The samples were then removed from the chromic acid bath and immersed in a still tank of tap water to remove excess chromic acid. At this point they were rinsed for 15 minutes in tap water. They were then immersed in a solution consisting of 150 grams of sodium bisulfite ('Baker Analyzed ®' Reagent) dissolved in 1 liter of tap water for 15 minutes. The parts were then rinsed in tap water for 15 minutes.

3. Glass Etching Procedure

A glass etching solution was made by dissolving 150 grams of ammonium bifluoride in 0.4 liters of deionized water in a Teflon ® beaker. 25 milliliters of concentrated sulfuric acid was added slowly to this solution with agitation. The final volume was brought up to 0.5 liters with deionized water. Selected complexes of resin containing glass fibers, as noted in Table 1, were immersed in this solution and agitated for 10 minutes, then immersed and agitated in a 25% solution of concentrated sulfuric acid in deionized water for 30 minutes. They were then rinsed in tap water for 10 minutes.

4. Electroless Nickel

Electroless nickel plating was carried out using a commercial process available from Enthone Incorporated, West Haven, Conn. 06516. The samples were first placed in a 10 volume % solution of Enthone promoter 3923 in deionized water for 3 minutes. The samples were then washed in tap water for 2 minutes and deionized water for 2 minutes. The samples were then placed in Enthone activator 444 solution (1.5 volume % 444 plus 25 volume % analytical reagent grade hydrochloric acid and 73.5 volume % deionized water) for 3 minutes. The samples were then washed in tap water for 2 minutes and deionized water for 2 minutes. The samples were then immersed in a solution of Enthone accelerator 860 (10 volume % in deionized water) for 3 minutes. The samples were then washed in tap water for 2 minutes and deionized water for 2 minutes. Electroless nickel plating was carried out by immersing and agitating the samples in an Enthone Ni-423 bath made up according to standard operating instructions for 6 minutes at 80° C. and pH 5.0. The parts were then rinsed in warm tap water and air dried.

Annealing was carried out at 200° C. for 5 hours to further improve plating adhesion.

Electroplating with 1.5 mils of copper was then performed to measure adhesion by the ASTM B533 90 degree peel test. The electroless nickel was cleaned and activated for electroplating by immersion in a solution of Enthone 810 cleaner (120 grams per liter of tap water) for 5 minutes at 75° C. The parts were then rinsed in hot tap water for 30 seconds, cold tap water for 30 seconds and deionized water for 5 to 10 seconds. They were then immersed in a 10% solution of sulfuric acid in deionized water at 35° C. for 2 minutes. The parts were removed and drained for 15 seconds and placed immediately in a bright acid copper electroplating strike bath and plated at 10 amperes/square foot for 2 minutes.

This strike bath was made by dissolving 255 grams of copper sulfate (Cupric sulfate, purified crystals, Banco TM, Anderson Laboratories Inc.) in a solution of 1.332 liters of concentrated sulfuric acid dissolved in 3 liters of deionized water. 0.66 milliliters of hydrochloric acid (36.5–38%, 'Baker Analyzed ®' Reagent) were added to this solution. This was followed by the addition of Enthone additives HT-1 (30 milliliters), HT-2 (6 milliliters) and HT-3 (0.14 milliliters) and finally deionized water to bring the total volume to 6 liters.

The parts were then plated in a bright acid copper plating bath at 35 amperes/square foot for 50 minutes.

This plating bath was made by dissolving 510 grams of copper sulfate in a solution of 0.666 liters of concentrated sulfuric acid dissolved in 3 liters of deionized water. 0.66 milliliters of hydrochloric acid were added to this solution. This was followed by the addition of Enthone additives HT-1 (30 milliliters), HT-2 (6 milliliters) and HT-3 (0.14 milliliters) and finally deionized water to bring the total volume to 6 liters.

Both electroplating baths were operated at room temperature with nitrogen bubble agitation. Samples were washed in tap water for approximately 1 minute after plating and then air dried.

The quality of adhesion was measured by the 90 degree peel test specified in ASTM B533. The results are shown in Table I.

EXAMPLE 9

Steps 1 to 3 as described above were completed. Step 5 was then conducted.

5. Electroless Copper Plating

A commercial process available from OMI International Corporation, Orange, Calif. was used. The etched samples were immersed in a standard solution of Predip CP3023 for 5 minutes. Then they were immersed in a standard solution of Catalyst CP3316 for 5 minutes. They were rinsed in tap water for 90 seconds followed by deionized water rinsing for 90 seconds. They were then immersed in Accelerator CP4044 for 5 minutes. They were rinsed in tap water for 90 seconds followed by deionized water rinsing for 90 seconds. They were then immersed in a fresh electroless copper bath CP5501 for 40 minutes at room temperature with constant agitation. They were then rinsed in tap water for 1 minute.

They were then immersed in a 10% solution of sulfuric acid in deionized water at 35 ° C. for 2 minutes. The parts were removed and drained for 15 seconds and placed immediately in a bright acid copper plating bath at 35 amperes/square foot for 50 minutes.

This plating bath was made by dissolving 510 grams of copper sulfate in a solution of 0.666 liters of concentrated sulfuric acid dissolved in 3 liters of deionized water. 0.66 milliliters of hydrochloric acid were added to this solution. This was followed by the addition of Enthone additives HT-1 (30 milliliters), HT-2 (6 milliliters) and HT-3 ( 0.14 milliliters ) and finally deionized water to bring the total volume to 6 liters. This electroplating bath operated at room temperature with nitrogen bubble agitation. Samples were washed in tap water for approximately 1 minute after plating and then air dried.

The parts were then annealed at 200° C. for 5 hours. On cooling they were tested for plating adhesion per ASTM B533, a 90 degree peel test. The results are shown in Table I.

TABLE I

| Sample No. | Polymer | Glass (%) | Glass Etch | Swelling Agent | Time (min) | Time Etch (min) | Peel Test (pli) |
|---|---|---|---|---|---|---|---|
| 1 | PEKEKK | 0 | NO | $H_2SO_4$ | 2.0 | 4 | 8.7 |
| 2 | " | " | " | " | 2.0 | 12 | 8.3 |
| 3 | " | " | " | " | " | " | 7.1 |
| 4 | " | " | " | " | " | " | 6.6 |
| 5 | " | " | " | " | " | " | 6.4 |
| 6 | " | " | " | " | " | " | 5.6 |
| 7 | " | " | " | " | 2.0 | 20 | 5.0 |
| 8 | " | " | " | " | 3.5 | " | 4.4 |
| 9[6] | " | " | " | " | " | " | 4.1 |
| 10 | " | " | " | " | " | " | 3.6 |
| 11 | " | " | " | " | 2.0 | 4 | 3.4 |
| 12 | " | " | " | " | 3.5 | 20 | 3.3 |
| 13 | " | " | " | " | 2.0 | 12 | 3.2 |

TABLE I-continued

| Sample No. | Polymer | Glass (%) | Glass Etch | Swelling Agent | Time (min) | Time Etch (min) | Peel Test (pli) |
|---|---|---|---|---|---|---|---|
| 14 | " | " | " | " | 3.5 | 20 | 2.7 |
| 15 | " | " | " | TFA: MeCl[1] | 3.0 | " | 1.2 |
| 16 | " | 5 | " | $H_2SO_4$ | 5.0 | " | 9.8 |
| 17 | " | " | " | " | 3.5 | " | 7.3 |
| 18 | " | " | YES | " | 5.0 | " | 2.8 |
| 19 | " | 10 | YES | " | 3.5 | " | 5.1 |
| 20 | " | " | NO | " | " | " | 4.7 |
| 21 | " | 20 | YES | " | 3.5 | " | 4.3 |
| 22 | " | 30 | NO | " | " | " | 7.8 |
| 23 | " | " | YES | " | " | " | 6.4 |
| 24 | " | " | YES | " | " | " | 11.1 |
| 25 | PEK | 5 | NO | " | " | " | 7.3 |
| 26 | PEKIa[2] | 0 | NO | " | " | " | 9.9 |
| 27 | PEKIc[3] | 0 | " | " | " | " | 6.1 |
| 28 | PEEK | 0 | YES | " | " | " | 0.6 |
| 29 | " | 5 | NO | " | " | " | 3.5 |
| 30 | " | " | " | " | " | " | 2.9 |
| 31 | " | " | YES | " | " | " | 2.5 |
| 32 | " | " | " | " | 2.0 | " | 1.7 |
| 33 | " | 20 | NO | " | 3.5 | " | 12.9 |
| 34 | " | " | YES | " | " | " | 9.9 |
| 35 | " | 30 | " | " | " | " | 12.0 |
| 36 | " | 40 | " | " | " | " | 6.5 |
| 37 | PEEK/ AFLAS[4] | 0 | NO | " | " | " | 6.8 |
| 38 | PEEK/ ULTEM[5] | 30 | " | " | " | " | 4.4 |

Footnotes to Table 1
[1] A 1 to 1 mixture of trifluoroacetic acid and methylene chloride was used as a swelling agent.
[2] An amorphous (non-crystalline) plaque of PEKI resin was prepared using a mold temperature of 200° C., which is below the material's glass transition temperature. The sample was annealed at 150° C. for 2 hours to remove residual stresses. It was annealed at 150° C. for 5 hours after plating.
[3] A semicrystalline plaque of PEKI resin was prepared by the following procedure. An amorphous (noncrystalline) plaque of PEKI resin was prepared using a mold temperature of 200° C., which is below the material's glass transition temperature. The sample was annealed at 240° C. for 1.5 hours while constrained in a press mold to induce crystallization and remove residual stresses. It was annealed at 200° C. for 5 hours after plating.
[4] The polymer sample was a blend of 80 wt. % PEEK and 20 wt. % Aflas.
[5] The polymer sample was a blend of 80 wt. % PEEK and 20 wt. % Ultem.
[6] All samples were electroless plated with nickel except sample 9 which was electroless plated with copper.

TABLE II

| Sample No. | Polymer | Glass (%) | Glass Etch | Swelling Agent | Time (min) | Time Etch (min) | Peel Test (pli) |
|---|---|---|---|---|---|---|---|
| 39 | PEKEKK | 30 | YES | NONE | 0 | 20 | 7.9 |
| 40 | " | 20 | " | " | " | " | 3.1 |
| 41 | " | 10 | " | " | " | " | 0.5 |
| 42 | " | 0 | NO | " | " | " | 1.0 |
| 43 | PEEK | 20 | YES | " | " | " | 5.8 |
| 44 | PEKEKK | 0 | NO | $H_2SO_4$ | 0.5 | 0 | 1.6 |

COMPARATIVE EXAMPLE 39-44

Polymer samples were treated as discussed above except that in the case of Examples 40-43 the step of contacting the polymer with a swelling agent was deleted and in the case of Example 44, the polymer etching step was deleted. The peel strength of the bond between the polymer surface and the metal was measured for each sample and the results are reported in Table II.

COMPARATIVE EXAMPLE 45

A sample of PEKEKK containing no glass filler was prepared as above and subjected to treatment in oleum (sulfuric acid, fuming, 18-24% Baker Analyzed Reagent) for 1 minute in accordance with a prior art process. The treated article was then electroless plated as described above. The bond strength between the PEKEKK surface and the metal was measured as above and found to be 2.4 pli.

COMPARATIVE EXAMPLE 46

A sample of PEKEKK containing no glass filler was prepared as discussed above except that a mixture consisting of 93 volume % N,N-dimethylformamide and 7 volume % water, based on the total volume of the mixture, was substituted for sulfuric acid with an immersion time of 2 minutes. This mixture did not swell the surface of the PEKEKK. The chromic acid etch time was 5 minutes.

The treated article was electroless plated as described above. The electroless plating did not adhere to the part and blistered on over 50% of the surface.

Novel articles having a surface comprising a poly(aryl ether ketone) and substantially no glass and/or mineral filler plated with a metal coating having a bond strength between the poly(aryl ether ketone) and the plated metal of at least about 3 pli, preferably at least about 4 pli, more preferably at least about 5 pli and most preferably at least about 6 pli, can be prepared using the process of this invention. Preferably the surface consists essentially of a poly(aryl ether ketone) or a blend of a poly(aryl ether ketone) and a polymer selected from the group consisting of carboxylated polymers, epoxy resins, fluoropolymers, fluoroelastomers, glycidyl ester copolymers, thermotropic liquid crystal polymers, phenolaldeyde resins, poly(amide imide), poly(amide), poly(benzobisthiazole), poly(carbonate), polyesters; poly(ether imides), poly(ether ketones) poly(ether sulfones), poly(imides), poly(phenylene oxide), poly(phenylene sulfide), poly(siloxanes) and poly(sulfones).

A preferred embodiment of the invention comprises an article having a surface consisting essentially of a poly(aryl ether ketone) plated with metal having a bond strength between the surface and the metal of at least about 3 pli, preferably at least about 4 pli, more preferably at least about 5 pli and most preferably at least about 6 pli.

Another novel article in accordance with this invention has a surface containing less than about 5% by weight, glass and/or mineral filler (based on the combined weight of the polymer and filler) having a plated metal coating thereon in which the bond strength between the surface and the metal coating is at least about 4 pli, preferably at least about 5 pli.

Yet another article in accordance with this invention has a surface comprising a poly(aryl ether ketone) composition containing less than about 10% by weight glass and/or mineral filler (based on the combined weight of the polymer and filler) having a plated metal coating thereon in which the bond strength between the surface and the metal coating is at least about 5 pli, preferably at least about 6 pli.

Still another article in accordance with this invention has a surface comprising a poly(aryl ether ketone) composition containing less than about 20% by weight glass and/or mineral filler (based on the combined weight of the polymer and filler) having a plated metal coating thereon in which the bond strength between the surface and the metal coating is at least about 7 pli, preferably at least about 8 pli.

A further article in accordance with this invention has a surface comprising a poly(aryl ether ketone) composition containing less than about 30% by weight, glass and/or mineral filler (based on the combined weight of the polymer and filler) having a plated metal coating thereon in which the bond strength between the surface and the metal coating is at least about 9 pli, preferably at least about 10 pli.

What is claimed is:

1. A method of coating a surface comprising a poly(aryl ether ketone) composition with metal which comprises:
a) treating the surface with a swelling agent for a period of time sufficient to swell the surface, said swelling agent being selected from the group consisting of (i) sulfuric acid and mixtures of sulfuric acid and phosphoric acid in which the phosphoric acid is less than 50% by weight based on the weight of the mixture , (ii) hydrofluoric acid, (iii) chlorosulfonic acid, (iv) fluorosulfuric acid, (v) trifluoroalkane sulfonic acids and mixtures thereof with antimony pentafluoride, tantalum pentafluoride, or niobium pentafluoride, (vi) mixtures of hydrogen fluoride with at least one of antimony pentafluoride, arsenic pentafluoride, tantalum pentafluoride, niobium pentafluoride, and boron pentafluoride, (vii) a Lewis acid-Lewis base complex in a diluent, (viii) diphenyl sulfone, and (ix) N-methyl caprolactam;
b) removing the swelling agent;
c) etching the treated surface; and
d) depositing metal on the etched surface to provide a first metal layer.

2. A method in accordance with claim 1 which further comprises the step of electroplating the surface obtained after step d) to provide a second metal layer.

3. A method in accordance with claim 1 wherein said swelling agent comprises concentrated sulfuric acid.

4. A method in accordance with claim 3 wherein said swelling agent comprises a mixture of concentrated sulfuric acid and up to 50% by weight orthophosphoric acid, based on the weight of the mixture.

5. A method in accordance with claim 1 wherein the swelling agent is removed by treating the swollen surface with a liquid compatible with the swelling agent.

6. A method in accordance with claim 5 wherein the liquid is water, methanol, ethanol or phosphoric acid.

7. A method in accordance with claim 6 wherein the liquid is water.

8. A method in accordance with claim 1, wherein the poly(aryl ether ketone) composition comprises a polymer having the repeat unit:

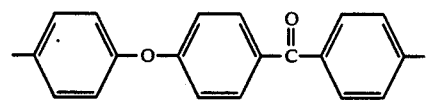

9. A method in accordance with claim 1, wherein the poly(aryl ether ketone) composition comprises a polymer having the repeat unit:

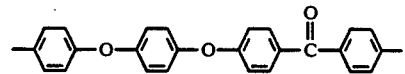

10. A method in accordance with claim 1, wherein the poly(aryl ether ketone) composition comprises a polymer having the repeat unit:

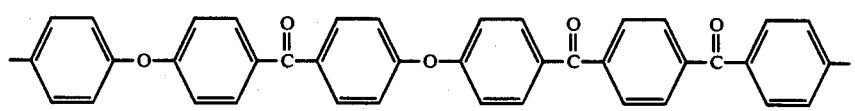

11. A method in accordance with claim 1, wherein the poly(aryl ether ketone) composition comprises a copolymer having the repeat units:

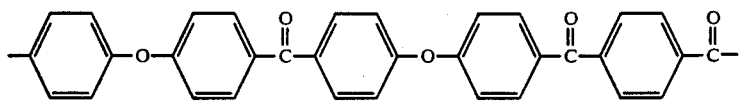

and

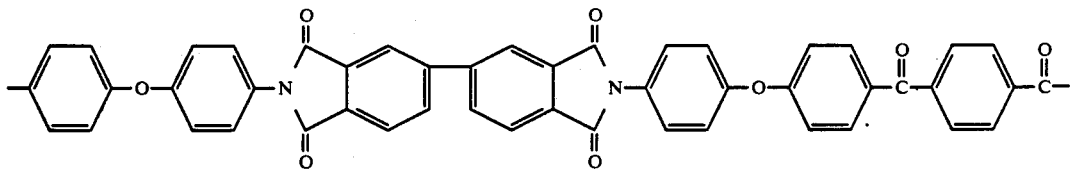

12. A method in accordance with claim 1 wherein the surface comprises a poly(aryl ether ketone) composition comprising a poly(aryl ether ketone) and one or more additives selected from the group consisting of pigments, stabilizers, fillers, and reinforcing agents.

13. A method in accordance with claim 12 wherein said composition contains a filler selected from glass fibers, mineral particles or mixtures thereof.

14. A method in accordance with claim 1 wherein the surface comprises a poly(aryl ether ketone) composition which comprises a blend of a poly(aryl ether ketone) and a polymer selected from the group consisting of carboxylated polymers, epoxy resins, fluoropolymers, fluoroelastomers, glycidyl ester copolymers, thermotropic liquid crystal polymers, phenolaldehyde resins, poly(amide imide), poly(amide), poly(benzobisthiazole), poly(carbonate), polyesters, poly(ether imides), poly(ether ketones) poly(ether sulfones), poly(imides), poly(phenylene oxide), poly(phenylene sulfide), poly(siloxanes) and poly(sulfones).

15. A method in accordance with claim 14 wherein said composition comprises a blend of a poly(aryl ether ketone) and a polyetherimide.

16. A method in accordance with claim 14 wherein said composition comprises a blend of a poly(aryl ether ketone) and a propylene-tetrafluoroethylene copolymer.

17. A method in accordance with claim 1 wherein steps b) and c) are performed simultaneously.

18. A method in accordance with claim 1 wherein the metal is gold, silver, copper, nickel, tin or palladium..

19. A method in accordance with claim 18 wherein the metal is nickel or copper.

* * * * *